United States Patent [19]

Tuan et al.

[11] Patent Number: 5,270,243
[45] Date of Patent: Dec. 14, 1993

[54] DRAM PERIPHERAL CIRCUIT CONTACT ASPECT RATIO IMPROVEMENT PROCESS

[75] Inventors: Hsiao-Chin Tuan; Yih-Fang Liu, both of Hsinchu, Taiwan

[73] Assignee: Industrial Technology Research Institute, Hsinchu, Taiwan

[21] Appl. No.: 35,232

[22] Filed: Mar. 22, 1993

[51] Int. Cl.$^5$ .................................. H01L 21/70
[52] U.S. Cl. .......................... 437/52; 437/47; 437/60
[58] Field of Search ............... 437/47, 48, 52, 60, 437/233

[56] References Cited

U.S. PATENT DOCUMENTS 5,135,881  8/1992  Saeki .......................... 437/919

FOREIGN PATENT DOCUMENTS 0398569  11/1990  European Pat. Off. .

Primary Examiner—Tom Thomas
Attorney, Agent, or Firm—George O. Saile

[57] ABSTRACT

A method and resulting structure for defining a dielectric layer thickness and etching openings having a desired aspect ratio through said dielectric layer covering regions in the peripheral circuits of a DRAM integrated circuit to be electrically contacted in a semiconductor wafer is described. The DRAM integrated circuit including the peripheral circuits to be electrically contacted is provide in the semiconductor wafer. A first conductive polysilicon layer is formed over said DRAM integrated circuit and the layer is patterned to leave the layer over the peripheral circuits. A first interlevel dielectric layer is formed over the polysilicon layer which has been patterned. A second conductive polysilicon layer is formed over the first interlevel dielectric layer and patterned to leave the layer over areas other than the peripheral circuits. The first interlevel dielectric layer and first polysilicon layer thereunder are masked and etched to remove the first interlevel dielectric layer and first polysilicon layer from all the peripheral circuits. A second interlevel dielectric layer is formed over the exposed second conductive polysilicon layer, first interlevel dielectric and semiconductor wafer. The openings having a desired aspect ratio are etched through said second interlevel dielectric layer.

16 Claims, 2 Drawing Sheets

DRAM PERIPHERAL CIRCUIT CONTACT ASPECT RATIO IMPROVEMENT PROCESS

BACKGROUND OF THE INVENTION (1) Field of the Invention

The invention relates to a method of defining a dielectric layer thickness over DRAM peripheral circuits and etching contact openings therethrough which have a desired aspect ratio.

(2) Description of the Prior Art

It is recognized in the integrated circuit technology the importance of the aspect ratio of electrical contacts. The aspect ratio is defined as the ratio of the depth of the opening to the width of the opening. The problem is becoming increasingly more difficult as the feature size, that is the width term is getting smaller while the depth term is becoming greater. The result of high aspect ratio openings is the need for better metallurgy processes to properly fill these contact openings to make the needed electrical contact to the regions at the bottom of the opening. An example of this advance of metallurgy processing is shown in U.S. Pat. No. 4,970,176 by Tracy et al.

There has been great progress in the development of DRAM integrated circuits over the recent years. The stacked capacitor has been particularly improved so as to maintain the desired capacitance while still reducing the dimensions of the cell array. Examples of improvements in stacked capacitors can be understood by reference to U.S. Pat. No. 5,110,752 by C. Y. Lu and to U.S. Pat. No. 5,126,916 to H. H. Tseng.

However, with this important DRAM progress in the cell array portion of the integrated circuit there have resulted problems, particularly in the peripheral circuits wherein very high contact aspect ratios are present. The obvious way to overcome these problems is to improve the metallurgy processes as described above. This approach does require new and more difficult to control processes to be brought into manufacturing.

It is an object of this invention to provide methods to overcome the DRAM peripheral circuit contact aspect ratio problem without using complex metallurgy processes.

It is a further object of this invention to provide a method which improves the contact aspect ratio in the peripheral circuits by reducing the height of the contact opening in a new way.

SUMMARY OF THE INVENTION

In accordance with the objects of the invention a method for defining a dielectric layer thickness and etching openings having a desired aspect ratio through said dielectric layer covering regions in the peripheral circuits of a DRAM integrated circuit to be electrically contacted in a semiconductor wafer is described. The DRAM integrated circuit including said peripheral circuits to be electrically contacted is provide in the semiconductor wafer. A first conductive polysilicon layer is formed over said DRAM integrated circuit and the layer is patterned to leave the layer over the peripheral circuits. A first interlevel dielectric layer is formed over the polysilicon layer which has been patterned. A second conductive polysilicon layer is formed over the first interlevel dielectric layer and patterned to leave the layer over areas other than the peripheral circuits. The first interlevel dielectric layer and first polysilicon layer thereunder are masked and etched to remove the first interlevel dielectric layer and first polysilicon layer from all the peripheral circuits. A second interlevel dielectric layer is formed over the exposed second conductive polysilicon layer, first interlevel dielectric and semiconductor wafer. The openings having a desired aspect ratio are etched through said second interlevel dielectric layer.

Further in accordance to the objects of the invention, a method is described for making a DRAM integrated circuit having a cell array composed of MOSFET devices and associated capacitors, and peripheral circuits wherein there is defined a dielectric layer thickness and etching openings having a desired aspect ratio through said dielectric layer covering regions in the peripheral circuits to be electrically contacted. There is formed in one portion of a semiconductor wafer the cell array of MOSFET devices and associated capacitors. There is formed in a second portion of the semiconductor wafer the peripheral circuits. A first conductive polysilicon layer is formed over the DRAM integrated circuit and the layer is patterned to leave the layer over the peripheral circuits. A first interlevel dielectric layer is formed over the polysilicon layer which has been patterned. A second conductive polysilicon layer is formed over the first interlevel dielectric layer and patterned to leave the layer over the array cell areas and not over the peripheral circuits. The first interlevel dielectric layer and first polysilicon layer thereunder are masked and etched to remove the first interlevel dielectric layer and first polysilicon layer from all the peripheral circuits. A second interlevel dielectric layer is formed over the exposed second conductive polysilicon layer, first interlevel dielectric and semiconductor wafer. The openings having a desired aspect ratio are etched through said second interlevel dielectric layer.

BRIEF DESCRIPTION OF THE PREFERRED EMBODIMENTS

Figure 2:
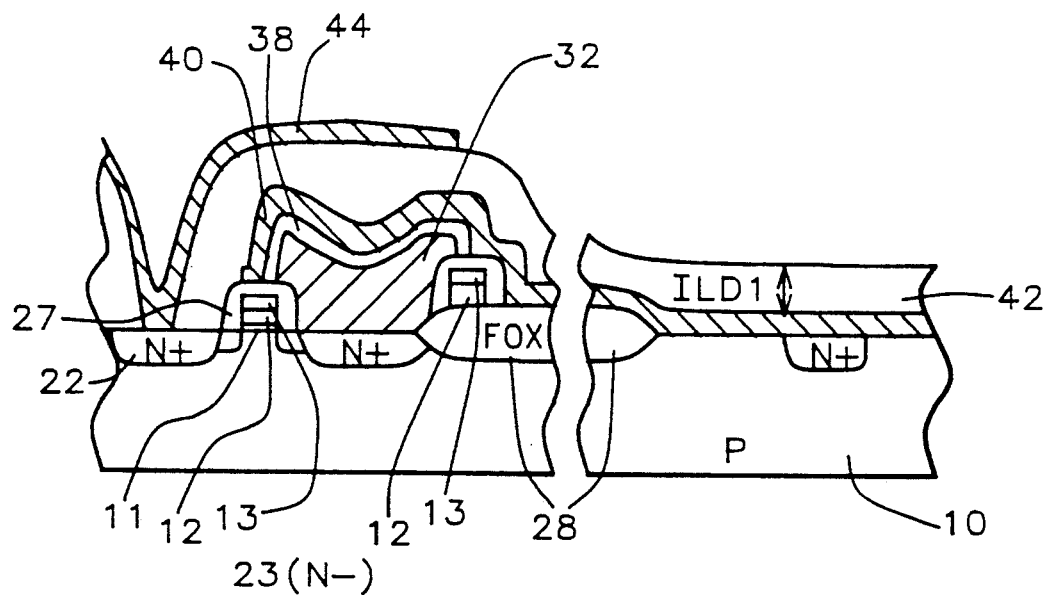
FIG. 2 and FIG. 3 are cross-sectional, schematic illustrations which aid in the understanding of one method of practicing the present invention.
Figure 3:
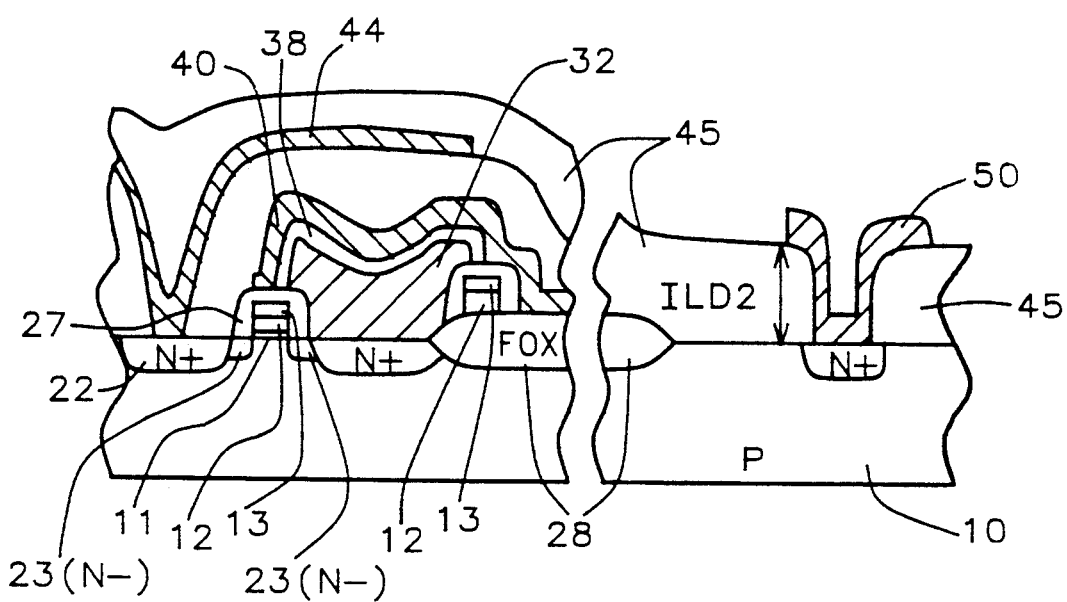

Referring now to FIGS. 2 and 3, there is illustrated the new DRAM process and structure having a desired low aspect ratio peripheral contact opening structure. The first series of steps to form this structure involves the formation of the dielectric isolation regions for isolating semiconductor surface regions from other such regions in the semiconductor substrate 10. The semiconductor substrate is preferably composed of P type silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 28. Then semiconductor devices can be provided in the silicon mesas according to the following processes.

The surface of the silicon substrate 10 is thermally oxidized to form the desired gate oxide 11 thickness. The preferred thickness is between about 80 to 200 Angstroms. The polysilicon layer 12 is blanket deposited by LPCVD (Low Pressure Chemical Vapor Deposition) method. The preferred thickness of the polysilicon layer 12 is between about 2000 to 4000 Angstroms. The polysilicon layer 12 is ion implanted with phosphorous or arsenic ions under the conditions 5 to 10 E 15 dosage atoms per cm$^2$ and 20 to 60 Kev. or doped with phosphorus oxychloride at a temperature about 900° C. The surface of the layer is either thermally oxidized or a chemical vapor deposition process to form silicon oxide layer 13. The layers 12 and 13 are patterned by conventional lithography and anisotropic etching techniques as are conventional in the art to provide a desired pattern of gate electrodes and structure on the FOX 28 surfaces or elsewhere as seen in FIG. 2.

The source/drain structure of the MOS FET may now be formed by the following steps. The FIG. 2 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 2, for example shows the ion implantations of N-dopants. Lithographic masks may be required to protect the areas not to be subjected to that particular N- ion implantation. The formation of the lithographic masks are done by conventional lithography and etching techniques. The N- lightly doped drain implantation 23 are done with, for example phosphorous P31 at a dose of between about 1 to 10 E 13 atoms/cm.$^2$ and with an energy of between about 20 to 70 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 2000 to 5000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

The N+ source/drain ion implantation uses Arsenic, As75 with a dose of between about 2 E 15 to 1 E 16 atoms/cm.$^2$ and energy of between about 20 to 70 Kev. to complete the source/drain regions 22 of the N channel lightly doped drain MOS FET integrated circuits device as seen in the FIG. 2.

The capacitor structure is fabricated by depositing a polycrystalline silicon layer 32 for the capacitor node over the surface of the substrate 10 using the same deposition techniques described in regard to polycrystalline silicon layer 12. The thickness of the first layer is typically between about 3000 to 6000 Angstroms. An impurity is introduced into the first layer, either by ion implantation techniques or in situ doping. The impurity concentration in this first layer 32 is preferably between about $5 \times 10^{18}$ to $10^{21}$ atoms per cm.$^3$.

A thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide (ONO) with a total thickness of between about 40 to 150 Angstroms. Alternatively, and of particular importance for the future is the dielectric tantalum oxide, such as tantalum pentoxide or in combination with silicon dioxide and/or silicon nitride.

As shown in FIG. 2, a first polycrystalline silicon layer 40 is deposited over layer 38 and patterned to serve as the second or plate electrode. Also, critically for the present process the first polysilicon layer 40 is patterned by lithography and etching techniques to cover all peripheral areas where the desired low aspect ratio openings are needed. This layer will be used as an etchstop in a later step in this process. The first polycrystalline silicon layer 32 is the storage node of the capacitor. The first polycrystalline silicon layer is also doped with an impurity, preferably with a concentration in the range of about $5 \times 10^{18}$ to $10^{21}$ atoms per cm.$^3$.

The completion of the electrical contacts to the monocrystalline silicon regions such as the bit line 44 contact to source regions 22 is now conventionally accomplished. Insulating first interlevel dielectric layer structure 42 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 22 or the like in the device regions. The openings are not shown to the other regions at this time. This process step is conventionally done by lithography and etching technique which preferably use a reactive ion etching process that will anisotropically etch both components of the insulating layer structure 42. A typical reactive ion etching process using fluorine, such as CHF$_3$, CF$_4$ or the like containing etching chemical species. These oxide/glass layers etching processes are well known to those in the art. The size of the contact window opening can be as small as limitation of the etching and lithography patterning capability.

A second conductive polysilicon, metal or composite metal layer or polycide composite layer (such as tungsten polycide) 44 is deposited over the exposed device region 24 and the insulating layer structure 42 both above and on the sides of the opening. This layer will be the bit line contact. This layer may be deposited by, for example chemical vapor deposition or sputtering. The operational thickness is between about 2000 to 10,000 Angstroms and the preferred thickness is between about 5000 to 7000 Angstroms. The thickness of this layer 44 is dependant upon the height and profile of the contact hole.

The second polysilicon layer or the like 44 is critically patterned as seen in FIG. 2 by conventional lithography and etching so as to not be present within the peripheral circuit areas requiring the desired low aspect ratio contact openings.

Referring now more particularly to FIG. 3, the next critical steps in the process of the invention are the removal by lithography and etching techniques of the first interlevel dielectric layer 42. This layer is removed by etching using fluorine, such as $CHF_3$, $CF_4$ or the like based chemical etching.

The etchant does not effect the polysilicon layer 40, so the etching process ends at this etchstop layer. The lithography mask (not shown) is used to remove the exposed layer 40 by etching using chlorine, $Cl_2$ as the etching ambient.

A suitable second interlevel dielectric insulating layer 45 is formed over the exposed second conductive polysilicon layer (bit line) 44, the remaining first interlevel dielectric layer and semiconductor wafer. This layer may be a composite layer of, for example the same material as was the first interlevel layer dielectric layer; silicon oxide, cured spin-on-glass and silicon oxide; or other layers as is known in the art. The thickness of this second interlevel dielectric layer is between about 3000 to 8000 Angstroms.

The peripheral circuit areas which require low aspect ratio openings only have the thickness of the second interlevel dielectric layer thereover. Openings are made through the second interlevel dielectric layer 42 by conventional lithography and etching techniques. Where the top layer of the second interlevel dielectric is composed of a glass such as boron phosphosilicate or the like, a heating of the structure to a temperature of between about 800° to 950° C. for between about 30 to 60 minutes will cause a flow of this layer and provide a sloped, rather than sharp corner at the top of the openings as seen in FIG. 3.

The metallurgy 50, which is typically aluminium, aluminum/silicon, tungsten or aluminum/silicon/copper, is then deposited by conventional and well understood evaporation, sputtering, chemical vapor deposition or the like and patterned using lithography and etching techniques to produce the final structure shown in FIG. 3.

Figure 1:
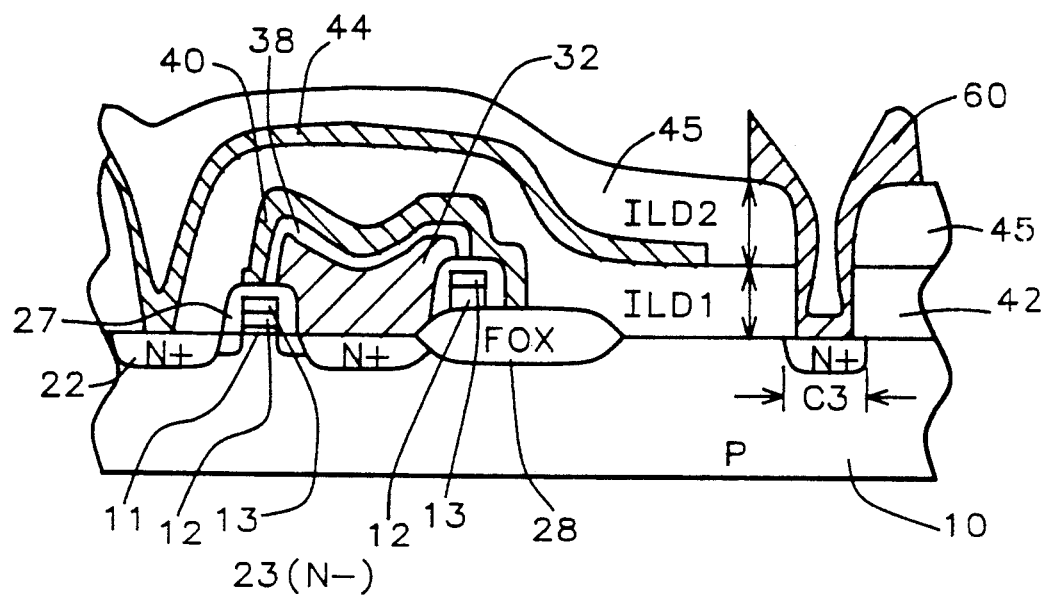
FIG. 1 is a cross-sectional, schematic drawing showing the Prior Art high aspect ratio openings in the peripheral circuit portions of the DRAM integrated circuit.

The Prior Art structure as seen in FIG. 1, does not use the critical steps described above to provide low aspect ratio openings in the peripheral circuit areas. We use like numbers to indicate like structures in the Figs. It can be seen that the first polysilicon layer 40 is used exclusively as the plate for the capacitor and was patterned therefor. Also, the second conductive polysilicon or the like layer 44 is used within the peripheral circuit areas. Further, the contact openings to peripheral circuit areas have both first and second interlevel dielectric layers 42, 45 thereover. The result is the undesirable high aspect ratio for these contact openings. The metallurgy 60 filling these openings will have to be very advanced or will have undesirable step coverage as schematically shown in FIG. 1.

The problems of step coverage and high aspect ratio and our improvement produced by our invention can be understood further by the following example. The aspect ratio of a 0.8 micrometer diameter contact in the prior art (FIG. 1) will be easily greater than 1.0 micrometers, while the number of this invention will be less than 0.7 micrometers. Also, the aluminum based metallurgy step coverage will be less than 10% and 30% correspondingly.

While the invention has been particularly shown and described with reference to the preferred embodiments thereof, it will be understood by those skilled in the art that various changes in form and details may be made without departing from the spirit and scope of the invention.

What is claimed is:

1. The method for defining a dielectric layer thickness and etching openings through said dielectric layer covering regions in the peripheral circuits of a DRAM integrated circuit to be electrically contacted in a semiconductor wafer comprising:

providing within and over said semiconductor wafer said DRAM integrated circuit including said peripheral circuits to be electrically contacted;

forming a first conductive polysilicon layer over said DRAM integrated circuit and patterning said layer to leave the layer over said peripheral circuits;

forming a first interlevel dielectric layer over said polysilicon layer which has been patterned;

forming a second conductive layer over said first interlevel dielectric layer and patterning said second conductive layer to leave exposed second conductive layer over areas other than said peripheral circuits;

masking and etching said first interlevel dielectric layer and said first polysilicon layer thereunder to remove said first interlevel dielectric layer and first polysilicon layer from all said peripheral circuits; forming a second interlevel dielectric layer over said exposed second conductive layer, first interlevel dielectric and semiconductor wafer; and etching said openings having a desired aspect ratio through said second interlevel dielectric layer.

2. The method of claim 1 wherein said first conductive layer acts as an etchstop for said etching of said first interlevel dielectric layer.

3. The method of claim 1 and further comprising filling said openings with aluminum metal to electrically contact said regions in said semiconductor wafer.

4. The method of claim 3 wherein said aluminum metal is deposited by a sputtering process.

5. The method of claim 1 wherein said first interlevel dielectric layer has a thickness of between about 3000 to 12000 Angstroms and said second interlevel dielectric layer has a thickness of between about 3000 to 8000 Angstroms.

6. The method of claim 5 wherein said desired aspect ratio is less than about 0.7 and the feature size of said openings to said peripheral circuit regions is less than about 0.8 micrometers.

7. The method of claim 1 wherein said second conductive layer is exposed of doped polysilicon.

8. The method of claim 1 wherein said second conductive layer is composed of phosphorus doped polysilicon.

9. The method for making a DRAM integrated circuit having a cell array composed of MOSFET devices and associated capacitors, and peripheral circuits wherein there is defined a dielectric layer thickness and etching openings through said dielectric layer covering regions in the peripheral circuits to be electrically contacted comprising:

forming in one portion of a semiconductor wafer said cell array of MOSFET devices and associated capacitors;

forming in a second portion of said semiconductor wafer said peripheral circuits;

forming a first conductive polysilicon layer over said cell array and said peripheral circuits, and patterning said layer to leave the layer over said peripheral circuits;

forming a first interlevel dielectric layer over said polysilicon layer which has been patterned;

forming a second conductive layer over said first interlevel dielectric layer and patterning said second layer to leave exposed second conductive layer over areas other than said peripheral circuits;

masking and etching said first interlevel dielectric layer and said first polysilicon layer thereunder to remove said first interlevel dielectric layer and first polysilicon layer from all said peripheral circuits;

forming a second interlevel dielectric layer over said exposed second conductive layer, first interlevel dielectric and semiconductor wafer; and etching said openings having a desired aspect ratio through said second interlevel dielectric layer.

10. The method of claim 9 wherein said first conductive layer acts as an etchstop for said etching of said first interlevel dielectric layer.

11. The method of claim 9 and further comprising filling said openings with aluminum metal to electrically contact said regions in said semiconductor wafer.

12. The method of claim 11 wherein said aluminum metal is deposited by a sputtering process.

13. The method of claim 9 wherein said first interlevel dielectric layer has a thickness of between about 3000 to 12000 Angstroms and said second interlevel dielectric layer has a thickness of between about 3000 to 8000 Angstroms.

14. The method of claim 13 wherein said desired aspect ratio is less than about 0.7 and the feature size of said openings to said peripheral circuit regions is less than about 0.8 micrometers.

15. The method of claim 9 wherein said second conductive layer is composed of doped polysilicon 16. The method of claim 9 wherein said second conductive layer is composed of arsenic doped polysilicon.

* * * * *